(12) United States Patent
Jarboe, Jr. et al.

(10) Patent No.: US 7,834,615 B2
(45) Date of Patent: Nov. 16, 2010

(54) BIST DDR MEMORY INTERFACE CIRCUIT AND METHOD FOR SELF-TESTING THE SAME USING PHASE RELATIONSHIP BETWEEN A DATA SIGNAL AND A DATA STROBE SIGNAL

(75) Inventors: James Michael Jarboe, Jr., Allen, TX (US); Sukanta Kishore Panigrahi, Bangalore (IN); Vinay Agrawal, Bangalore (IN); Neeraj P. Nayak, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 157 days.

(21) Appl. No.: 11/772,256

(22) Filed: Jul. 2, 2007

(65) Prior Publication Data
US 2009/0009206 A1    Jan. 8, 2009

(51) Int. Cl.
*G01R 31/02*    (2006.01)
(52) U.S. Cl. .................................... 324/158.1
(58) Field of Classification Search ........................ None
See application file for complete search history.

(56) References Cited
U.S. PATENT DOCUMENTS
6,452,849 B1 * 9/2002 Iwamoto ..................... 365/201
7,126,366 B2 * 10/2006 Ohashi et al. ................ 324/765
7,457,174 B2 * 11/2008 Braun et al. ................. 365/193

\* cited by examiner

*Primary Examiner*—Paresh Patel
(74) *Attorney, Agent, or Firm*—Lawrence J. Bassuk; W. James Brady; Frederick J. Telecky, Jr.

(57) ABSTRACT

An apparatus and method for self-testing a DDR memory interface are disclosed. In one aspect, a built-in-self-test (BIST) memory interface circuit includes a signal multiplier for receiving a first clock signal from a tester and outputs a multiplied clock signal. A first multiplexer is used for selecting between a test mode and a normal operating mode and provides an output signal. A delay magnitude generator is coupled to the signal multiplier to receive the multiplied clock signal and provides a second clock signal and a phase control signal. A plurality of digitally controlled delay line blocks are used for each receiving the second clock signal and the phase control signal and outputting a phase shifted data strobe output signal in response to receiving an internal data strobe input signal. A second multiplexer selects one of the internal data strobe input signals and a third multiplexer selects the phase shifted data strobe output signal that corresponds to the selected internal data strobe input signal. A phase detector determines a phase difference between the selected internal data strobe input signal and the selected phase shifted data strobe output signal and outputs a phase difference value.

6 Claims, 5 Drawing Sheets

BIST DDR MEMORY INTERFACE CIRCUIT AND METHOD FOR SELF-TESTING THE SAME USING PHASE RELATIONSHIP BETWEEN A DATA SIGNAL AND A DATA STROBE SIGNAL

FIELD OF TECHNOLOGY

The present invention relates generally to computer memory devices. In particular, it relates to a DDR memory interface having built-in self testing capability and method for testing the same.

BACKGROUND

Since the advent of personal computers, there has been an ongoing need for improved system performance and reduced cost of system on chip (SoC) design and manufacture. A vital aspect of the personal computers is the use of Synchronous Dynamic Random Access Memory (SDRAM) device. The SDRAM operates at a substantially higher speed compared to other types of conventional memory devices such as SRAM, DRAM, and the like. SDRAM is also used in a host of electronic devices including cell phones, PDAs, and gaming systems.

In conventional memory devices, a processor writes a data into an output port and the data appears at the output pins. There is no indication that new data is available. Further, data transmission is triggered by a rising or falling edge of a system clock. More advanced memory devices such as SDRAMs require synchronization techniques which notify a memory controller when new data is at an input port of an SoC and subsequently notify the SDRAM when new data is at an output port of an SoC. SDRAM employing dual data rate (DDR) technique operates at twice the operational speed of the conventional memory devices as data transmission is triggered by both the rising and falling edges of the system clock.

In some cases, synchronization is achieved by using an additional control signal called a strobe signal which is triggered upon the occurrence of a data input or a data output. In such cases, upon the occurrence of a data input, the SDRAM generates a strobe pulse which accompanies the data input, and the memory controller must read the data before a next strobe pulse occurs. In the case of a data output, the memory controller generates a strobe pulse after it writes new data which is subsequently captured by the SDRAM.

The high operating speed of a DDR SDRAM device poses many challenges for testing the I/O interface of the DDR SDRAM at the device testing stage. Typically, the memory interface circuit residing in the memory controller is tested using an (external) automated test equipment (ATE). However, conventional ATE is not able to handle memory devices operating higher than single data rate (i.e. operating at either rising or falling edges but not at both edges) due to process variations within the DDR interface. To modify the ATE to cater for DDR memory devices is not cost effective. To capture data using the strobe signal, the strobe signal is delayed by a certain phase to satisfy the data setup time requirement. Therefore, it is important that the data and strobe signals are aligned properly with respect to such requirements. The applications that use DDR memory interfaces are designed to expect a specific tolerance or phase relationship in alignment between the data and the strobe signals. Verifying the tolerance or phase relationship is important for determining if the DDR memory interface will perform as expected. However, it is difficult to verify the phase relationship between the data and strobe signals at the DDR memory interface. In addition, routing sensitive signals along the DDR memory interface causes signal degradation problems as well as requiring additional pins on the DDR memory device to be connected to the ATE. Another disadvantage with existing ATE is that it is limited to testing a substantially fewer number of memory devices simultaneously.

Therefore, there exists a need for a DDR memory interface having a built-in self testing capability that is capable of testing high speed data transmission and measuring the phase difference between the data and strobe signals with a substantially high degree of accuracy.

SUMMARY

An apparatus and method for self-testing a DDR memory interface are disclosed. In one aspect, a built-in-self-test (BIST) memory interface circuit comprises a signal multiplier for receiving a first clock signal from a tester and outputs a multiplied clock signal. A first multiplexer is used for selecting between a test mode and a normal operating mode and provides an output signal. A delay magnitude generator is coupled to the signal multiplier to receive the multiplied clock signal and provides a second clock signal and a phase control signal. A plurality of digitally controlled delay line blocks are used for each receiving the second clock signal and the phase control signal and a shifted data strobe output signal in response to receiving an internal data strobe input signal. A second multiplexer selects one of the internal data strobe input signals and a third multiplexer selects the phase shifted data strobe output signals corresponding to the selected internal data strobe input signal. A phase detector determines a phase difference between the the selected internal data strobe input signal and the selected phase shifted data strobe output signal.

BRIEF DESCRIPTION OF THE DRAWINGS

Embodiments of the invention are herein described, purely by way of example, with references made to the accompanying drawings, in which.

DETAILED DESCRIPTION

A built-in self testing DDR memory interface circuit and method for testing the same are disclosed. In the following description, for purposes of explanation, numerous specific details are set forth in order to provide a thorough understanding of various embodiments of the present invention. It will be evident, however, to one skilled in the art that the various embodiments may be practiced with appropriate variations and equivalences from these specific details.

In conventional memory devices, data is transmitted in response to a rising or falling edge of a system clock. In DDR SDRAM devices, data is transmitted on both the rising and falling edges of a clock signal thereby making the data transfer window substantially half the window size of that used in conventional memory devices. This narrow data window along with routing delays, variations of operating temperatures, voltages and physical geometries pose considerable problems in the integrity of data transfer. Hence, DDR memory devices require data transfer to take place instantaneously with the occurrence of a valid data to reduce or avoid memory access and propagation delays. Therefore, a data strobe signal (hereinafter referred to as DQS) is used to accompany data signals. DQS is generated within a memory controller and is derived from the DDR memory device functional clock, which in some applications is provided by an external clock reference. DQS is a non-continuous-running strobe for clocking data on the data lines and is transmitted externally along with the data signals (hereinafter referred to as DQ) to ensure that DQS tracks the data signal DQ while subject to the same temperature and voltage conditions. The (DDR) memory controller within a SoC device uses on-chip delay locked loops (DLLs) to output DQS relative to the corresponding DQ. The DQS toggles whenever DQ is present on the data lines.

The phase relationship between DQ and DQS is important at the DDR SDRAM interface. During a read operation, DQS is edge-aligned with DQ and is transmitted by the SDRAM. Whereas during a write operation DQS is center-aligned with DQ and is transmitted by the memory controller. The alignment of DQ and DQS is challenging due to the bidirectional nature of DQS and is a crucial component of testing the DDR memory interface.

Figure 1:
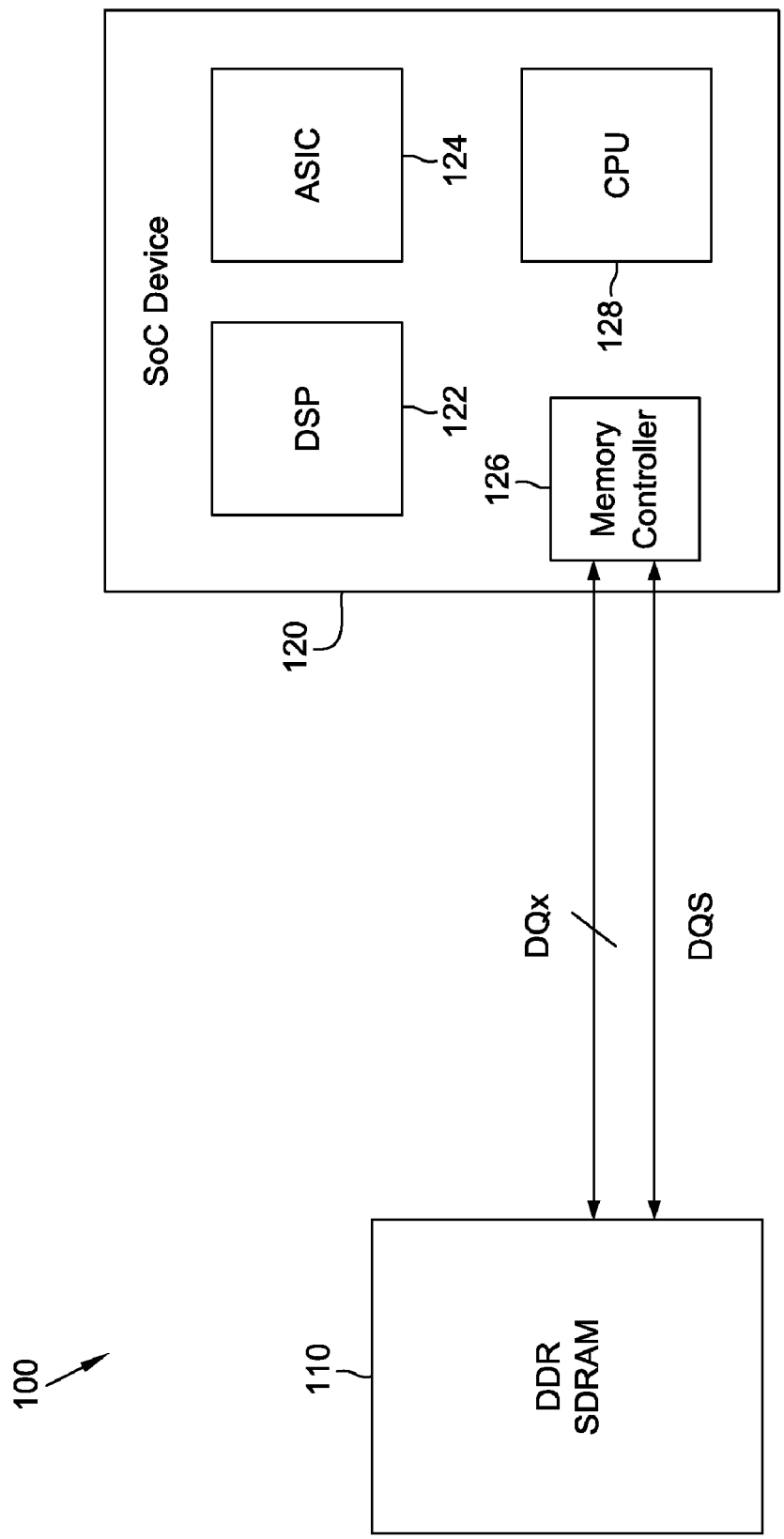
FIG. 1 shows an example of an interface between a DDR SDRAM and a SoC device according to an embodiment.

Referring to FIG. 1, there is illustrated an example 100 of an interface between a DDR SDRAM and a SoC device according to an embodiment. FIG. 1 illustrates the relationship of DQ and DQS at the interface of a DDR SDRAM 110 and an external device such as a system on chip (SoC) 120. As shown, the SoC 120 includes a digital signal processor (DSP) 122, an application specific integrated circuit (ASIC) 124, a memory controller 126 and a central processor unit (CPU) 128. The SoC 120 may be required to send data back and forth from a DDR compatible memory like the DDR SDRAM 110. Thus, the memory controller 126 is included to facilitate the transfer of data from a data bus using a corresponding DDR protocol. The DDR protocol includes data bits (DQx) and a strobe signal (DQS) per block of data bits. The data bus can vary in width depending on the application, but the bus is subdivided so that there is one strobe signal for a modular subset of the bus (e.g. 4 bits, 8 bits, etc.). A BIST DDR memory interface circuit resides in the memory controller (block 322 as shown in FIG. 3) that provides an on-chip built-in self-test capability for measuring and verifying the DQ-DQS phase alignment.

Figure 2:
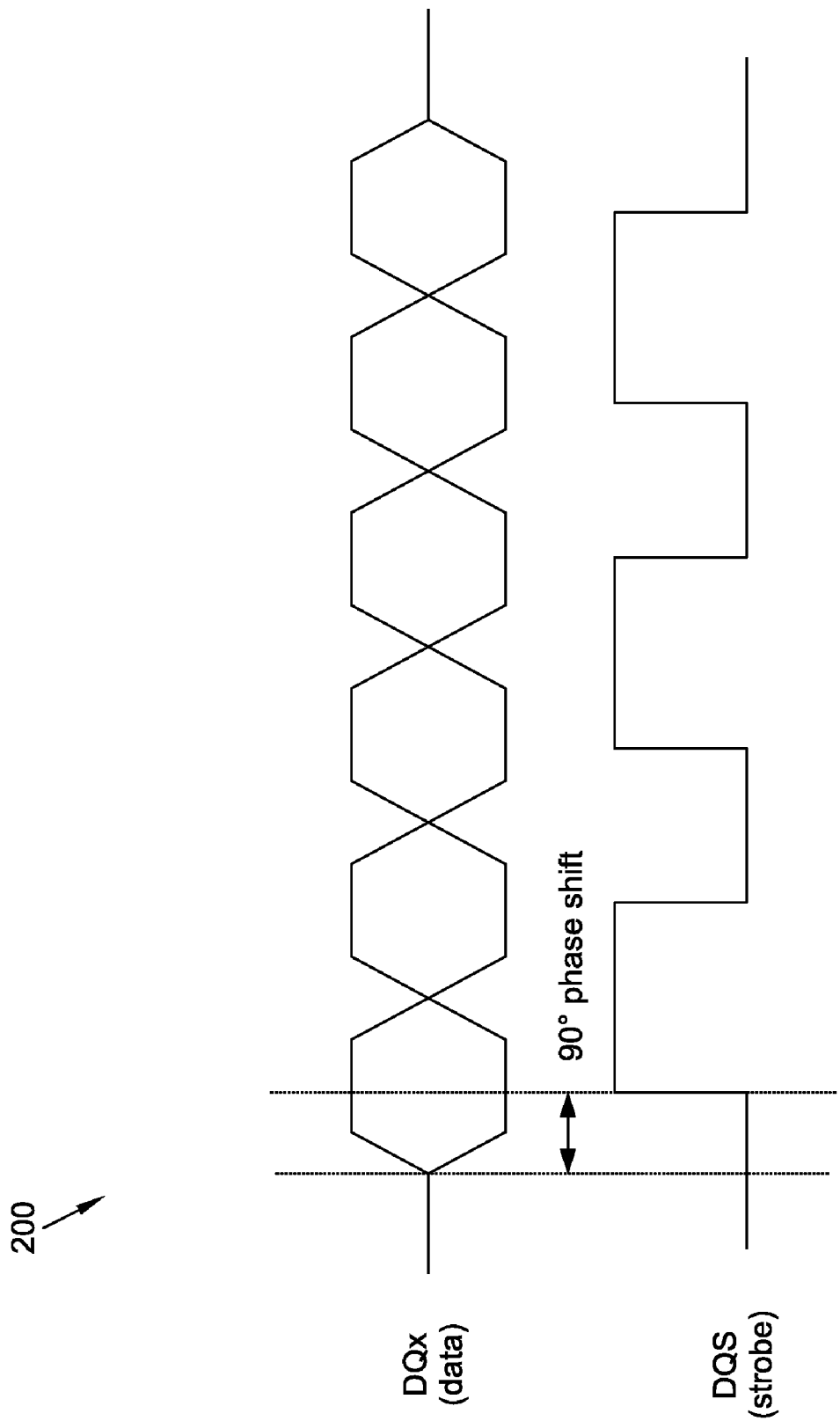
FIG. 2 shows an example of a timing diagram depicting a phase relationship between data and strobe signals at a DDR memory interface according to an embodiment.

Now referring to FIG. 2, there is illustrated an example of a timing diagram depicting a phase relationship between DQ and DQS at a DDR memory interface in accordance with an embodiment. The timing diagram illustrates that when the SoC performs a write operation to the DDR SDRAM 110, the memory controller 126 is responsible for generating a DQS that is center-aligned or 90 degrees out of phase with DQ. Although the example shows a phase shift of 90 degrees, typically, there are other possible degrees of phase shift. The exact values can vary from one design to another but are usually fixed and selectable by the system user.

Figure 3:
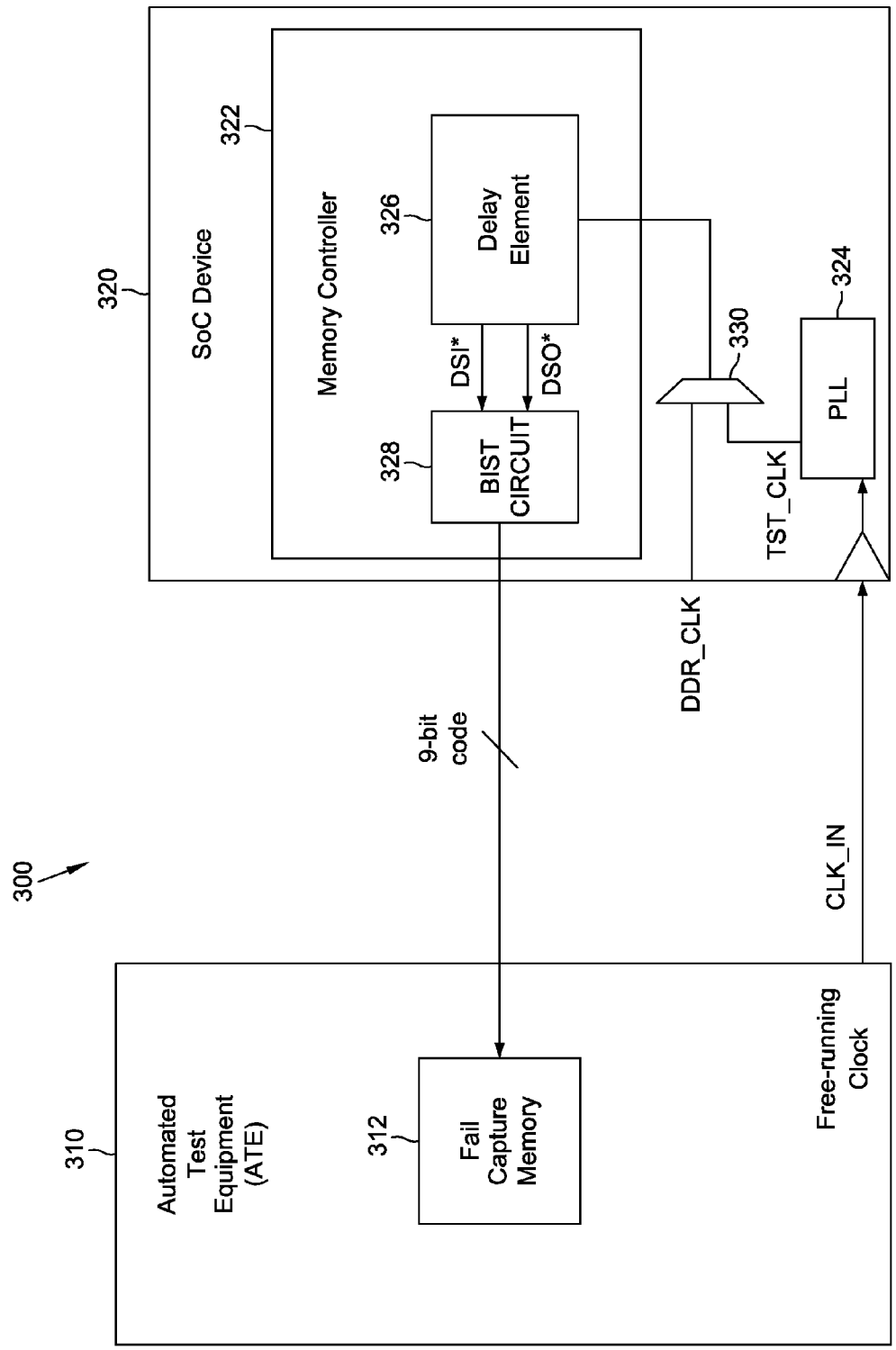
FIG. 3 shows an example of a SoC in production test mode according to an embodiment.

Now referring to FIG. 3, there is illustrated an example 300 of a SoC under production test mode according to an embodiment. As shown, a SoC device 320 under test is connected to an Automated Test Equipment (ATE) system 310. The SoC 320 includes a memory controller 322 among other elements (not shown) such as the DSP, ASIC, CPU. The memory controller 322 is in communication with ATE 310 and includes a BIST circuit (also referred to as memory interface circuit) that outputs a 9-bit digital code for verifying a phase measurement between DQ and DQS. The required connections to the ATE system 310 are minimal, as the test is performed inside the SoC device.

In an example embodiment, the memory controller 322 of FIG. 3 further includes a delay element 326, a BIST circuit 328, a PLL 324 and a multiplexer 330. The ATE 310 provides a free running clock CLK_IN as an input stimulus to the SoC 320. The free running clock is fed into a phase locked loop PLL 324, which multiplies the free running clock frequency to a value required by the DDR memory interface (shown in FIG. 1). The output of the PLL 324 is fed to a multiplexer 330 which also receives a DDR_CLK signal. The DDR_CLK is the clock for the DDR memory interface when it is operating in an application environment (i.e. non-testing mode) The DDR_CLK signal is responsible for generation of data strobe signals that are produced at each end of the memory interface within the SoC device as well as within the SDRAM itself. In test mode, the system clock (or main clock input to the SoC device) is switched into the path of the DDR_CLK to provide the input stimulus for the memory controller 322 so as to minimize the number of clock resources required on the ATE 310. The ATE 310 has a limited number of asynchronous, free-running clock resources. By using CLK_IN as a test clock from the ATE 310, it allows for a lower input frequency to be input at the SoC device, whereby an internal PLL is used to multiply the lower input frequency clock. The delay element block 326 in the memory controller 322 receives an input clock signal from the multiplexer 330. This input clock signal is fed through a delay element 325 which includes delay elements such as DLL and DCDL (not shown). The outputs of the delay element 325 are data strobe signals DSI* and DSO* (where *=0 to 4), which are a plurality of sequential input/output bit pair signals corresponding to an internal data strobe input signal, and a phase shifted data strobe output signal respectively. The DSI* and DSO* are then fed into a BIST circuit 328. The BIST circuit 328 receives selected inputs DSI and DSO and uses a phase detector to measure the phase difference between the DSI and DSO input/output bit pair signals and outputs a time value (phase difference value) in the form of a 9-bit digital code. The 9-bit digital code is subsequently sent to the ATE 310 either serially or in parallel. The internal workings of the delay element 326 will be apparent in the following FIG. 4 which describes the memory interface circuit in detail. In the example shown in FIG. 3, the 9-bit digital code is connected to a fail capture memory block 312 on the ATE 310, where the code is captured and compared to a range of valid delay codes for a pass/fail determination. In an alternative embodiment, the 9-bit digital code can also be latched into an internal device register and scanned out to the ATE 310 on a single pin if multiple device pins are not available to send out the full code. FIG. 3 is a high level representation of the delay elements and the PLL in the memory controller, the effect of which can be realized using different combination of delay elements. For example, the BIST circuit 328 and the delay element 326 are shown in more detail in FIG. 4 using a different configuration of delay elements inside the memory controller 326.

Figure 4:
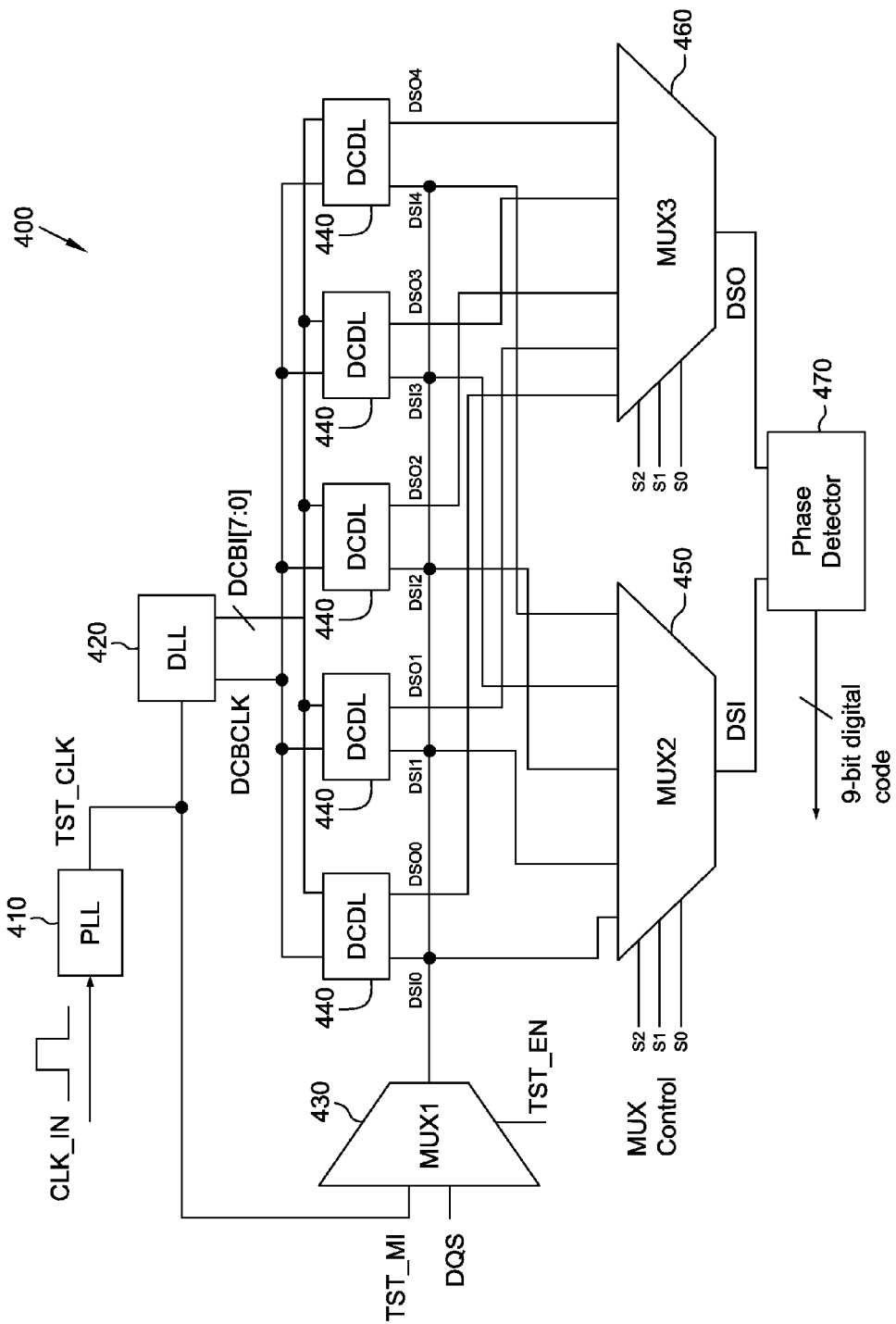
FIG. 4 shows an example of a DDR memory interface circuit having a BIST implementation according to an embodiment.

Now referring to FIG. 4, there is shown a DDR memory interface circuit 400 having a BIST implementation according to an embodiment. The memory interface circuit 400 includes a phase locked loop (PLL) 410, a delay magnitude generator in the form of a delay locked loop (DLL) 420, a test mode select multiplexer MUX1 430, a plurality of digitally controlled delay line (DCDL) blocks 440, a strobe input multiplexer MUX2 450, and a phase shifted strobe output multiplexer MUX3 460, and a phase detector 470. It may be noted that the delay mechanism may be utilized in a various number of alternate implementations and the memory interface circuit 400 includes the combination of several elements of the memory controller (322 of FIG. 3) such as the BIST circuit (328), delay element (326), and PLL (324 of FIG. 3).

When data is read from a DDR SDRAM device, the data (DQ) and strobe (DQS) signals are edge aligned, meaning they occur simultaneously. When the data signal is received at the SDRAM/SoC interface the edge of the DQS has not been adjusted to line up with the DQ in a data-valid region. The edge alignment between DQ and DQS signals is performed by the memory controller (as shown in FIG. 3) wherein the DDR memory interface circuit 400 resides. The purpose of the BIST circuitry 400 is to verify if the phase shift is accurate and if the interface is working properly.

MUX1 430 is controlled by a select line signal TST_EN which is used for switching the MUX1 430 mode of operation between a functional mode (i.e. normal memory operation mode) when DQS input is selected and a test mode during which the test mode input TST_MI is selected. When DQS is selected, the memory controller is ready to read data. During test mode, TST_MI is selected, and the output of the PLL 410 of the memory interface circuit 400 is selected.

Further, as depicted in FIG. 4, the PLL 410 receives the clock CLK_IN from an automatic test equipment (ATE) (310 of FIG. 3) external to the BIST circuit 400. The PLL 410 avoids the necessity to generate a higher speed signal externally from the ATE by multiplying the clock CLK_IN to provide an output clock signal TST_CLK with a frequency multiple of the clock CLK_IN. The multiplied output clock signal TST_CLK from PLL 410 is fed to DLL 420 and the test mode select multiplexer MUX1 430. The DLL 220 outputs a clock signal DCBCLK (hereinafter interchangeably called the phase shift clock) and a phase control input signal in the form of a 7-bit code value DCBI[7:0]. The outputs of the DLL 420 are fed to each of the plurality of DCDL blocks 440. The DCBI [7:0] is an 7-bit code value generated by the DLL block 420 for indicating the magnitude of delay needed for phase shifting a DQS signal out of each of the DCDL blocks 440. The DCBCLK clocks the 7-bit code value DCBI [7:0] into the plurality of DCDL blocks at a given rate and the code value is refreshed continuously in response to changes in voltage or temperature.

The DLL 420 and the DCDL blocks 440 function together to produce a particular phase of the data strobe signal, so as to delay the rising edge of the strobe signal. For example, if a 90 degree phase adjustment is required, the data strobe signal is placed right in the center of the data signal (as shown in FIG. 2). The DCDL blocks 440 are digitally controlled delay line blocks that delay the DQS signal passing through it with an amount of delay proportional to the value set by DCBI[7:0] at the phase control input of the DCDL blocks 440. The strobe signal is associated with a group of DQ signals, where the DQS to DQ ratio can be either 1:4, 1:8, 1:16, etc. In this example, there is one DQS signal for every 8 data bits at the memory interface. So, for a 32-bit DDR interface there are 4 DQS signals. Each DCDL block 440 corresponds to one DQS output, and the number of the DCDL blocks needed depends on the width of the data bus supported by the DDR interface. In this example, there are five DCDL blocks shown, and each of the DCDL blocks 440 outputs an input/output bit pair signals corresponding to a data strobe internal input (shown as DSI0, DSI1, DSI2, DSI3, and DSI4) and a corresponding phase shifted data strobe output (shown as DSO0, DSO1, DSO2, DSO3). The data strobe internal input DSI* corresponds to an internal representation of the data strobe and the phase shifted data strobe output is the delayed data strobe output DSO*. The DSI signals are derived directly from the clock input to the DDR interface The DSI* (where *=0 to 4) signals are internal signal names for the data strobe signal DQS. These DSI* signals are delayed so that the edges of these signals aligns with a certain position in a data valid region of the data signals. For example, if a 90 degree phase adjustment is needed, the DSI* is aligned in the center position of the data valid region. Therefore the DSO* (where *=0 to 4) signal is the phase delayed strobe output corresponding to the internal data strobe input, that would in the application be fed back into the particular sub system on the SoC chip that is requesting data from the DDR interface.

The bit select multiplexers MUX2 450 and MUX3 460, as shown in FIG. 4, include three select control lines S0, S1, and S2 which are used for respectively selecting a particular reference data input bit DSI and an associated phase shifted data output bit DSO. The selected DSI and DSO are subsequently fed to the phase detector 470 for phase difference analysis. The phase detector 470 outputs a 9-bit digital code which represents the phase difference detected between DSI and DSO. Once the DLL 420 locks, the test mode provides the phase detector block 470 with sequential access to the DSI/DSO bit-pair from each of the DCDL blocks 440. The DSI signal here is derived directly from the clock input to the DDR interface. In test mode, this clock TST_CLK is the output of the PLL 410 of the memory interface circuit 400. The DQ signals on the data bus are also aligned with this clock, and therefore the relationship between DSI and DSO signals is an internal representation of the relationship between DQ and DQS at the output of the DDR memory interface. The phase delayed data strobe signal DSO (hereinafter interchangeably called data strobe output signal) is fed back into the particular sub system on the SoC chip that is requesting the data from the DDR memory interface.

The phase detector 470 measures the time between the rising edges of DSI and DSO and converts the measurement into the 9-bit digital code, which is brought out to top-level pins for datalogging and pass/fail determination. The 9-bit digital code at the output of the phase detector 470 is a representation of the time between the rising edge that enters the SoC device and the delayed rising edge that is created through the DLL and DCDL network. It may be noted that the PLL, DLL and DCDL blocks are part of the chip/system functional design, while the multiplexers (430, 450 and 460) and the phase detector 470 are specific to the test mode implementation.

In an embodiment, the 9-bit digital code is brought out in parallel to external pins on the SoC (320 of FIG. 3). In this example, these external pins are connected to a fail capture memory block 312 on the ATE 310, where the 9-bit digital code is compared to a range of valid delay codes. In another embodiment, the delay codes may also be latched into an internal device register (not shown) and scanned out of the internal device register on a single pin if nine device pins are not available to transmit the code in parallel.

There is also a calibration path (not shown) that routes the PLL output directly to the phase detector circuit 470. Typically, the accuracy of the phase detector 470 is within +/−35 pico seconds depending on variations in PLL manufacturing process, operating voltage and temperature. Thus, the measured value of the PLL clock can be used to compute a calibration value to adjust the DSI/DSO phase measurements.

Figure 5:
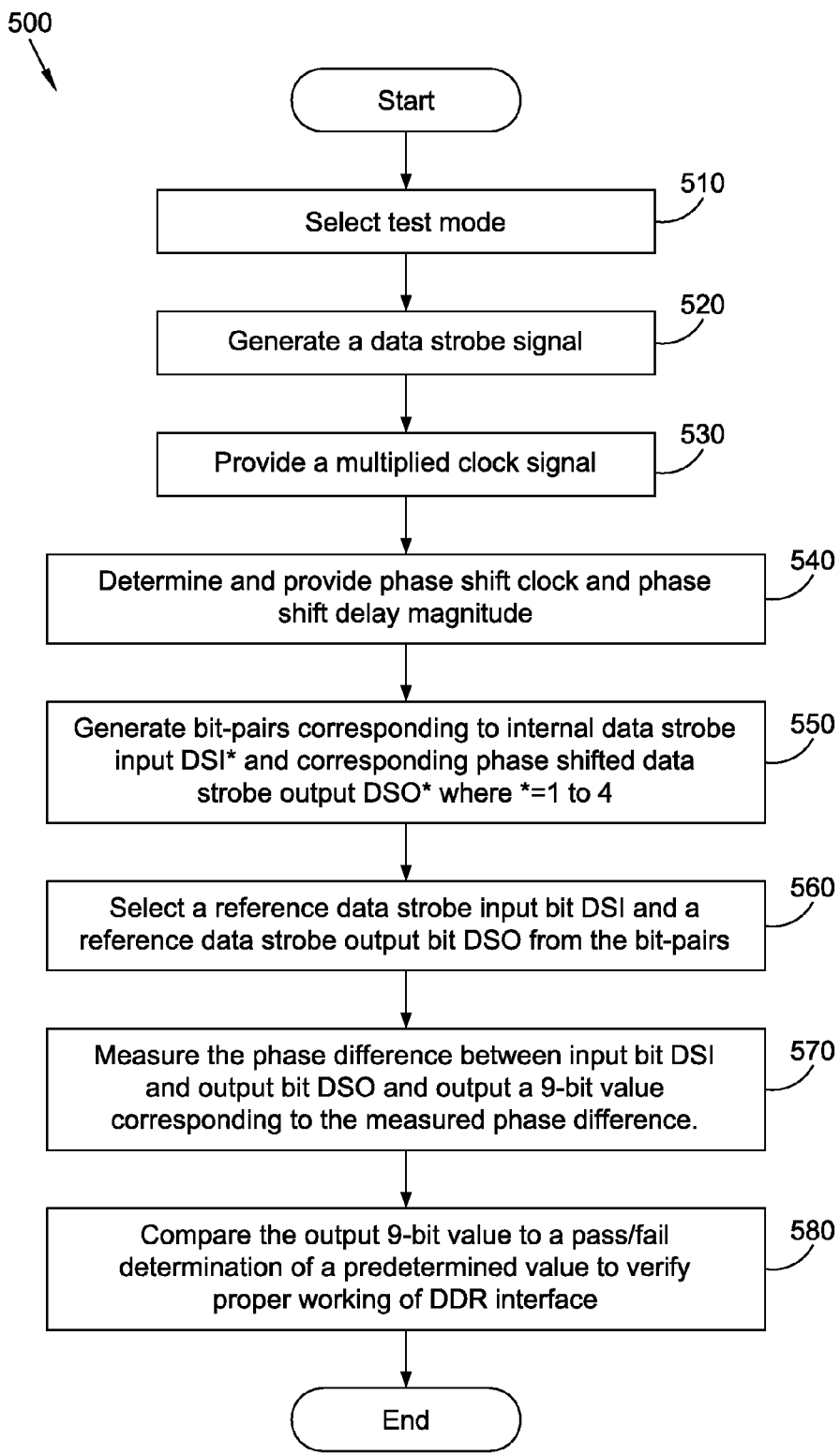
FIG. 5 is a flow diagram of a method for measuring the phase difference between the data and strobe signals at a DDR interface according to an embodiment.

FIG. 5 illustrates a flow diagram 500 for measuring the phase relationship between the data signal DQ, and data strobe signal DQS, at a memory interface according to an embodiment. At step 510, a test mode is selected using a test mode multiplexer (MUX1 430). At step 520, a data strobe signal is generated by providing an input clock stimulus to the SoC device. The test mode ensures that this input clock gets routed to the input circuitry on the DDR memory interface, and at step 530, multiplied clock signal is provided by using a phase locked loop (PLL 410) which receives as input a clock from ATE (310) and outputs the multiplied clock signal. At step 540, a delay locked loop (DLL 420) is used to output a phase shifted clock input DCBCLK and a phase control input DCBI [7:0] for determining the phase shifted delay magnitude. This value is repeatedly set and clocked by the DCBCLK. Step 550 generates an input/output data bit pair using digitally controlled delay line blocks (DCDL 440). The DCDL blocks receive as inputs the phase shifted clock DCBCLK, the phase shifted delay magnitude (7-big code value) from DLL 420, and an internal data strobe input DSI* and produce as outputs a corresponding phase shifted data strobe output DSO* where *=1 to 4, each of which forms the data bit pair. At step 560, using bit select multiplexers MUX2 (450) and MUX3 (460), a reference data strobe input bit DSI and an associated data strobe output bit DSO are selected from one of the output bit-pairs of the DCDL blocks Step 570 measures the phase difference between DSI and DSO and outputs a 9-bit digital code corresponding to the measured phase difference between DSI and DSO. At Step 580, a pass/fail determination compares the 9-bit digital code with a pre-determined value to verify that the phase shift is accurate and that the DDR interface is working properly.

The above-described method and apparatus illustrates a BIST technique for testing a memory interface circuit at a SDRAM interface. This technique provides many advantages and is particularly useful in testing the phase relationship between the data and strobe signals, without the use of external instrumentation. The phase detector circuit provides a highly accurate phase measurement (about +/−35 ps). Further, by making this measurement internally, signal degradation problems resulting from routing these sensitive signals along the device loadboard are avoided. The simple external stimulus (free running clock) permits testing of the DDR interface with a low-cost test solution. Also, the internal BIST circuitry helps to reduce the number of device pins that are required to connect to the tester, further providing simultaneous testing of higher numbers of SoC devices.

Although the present invention is described with reference to specific example embodiments as shown in FIGS. 1 to 5, it will be evident that various modifications and changes may be made to these embodiments without departing from the broader spirit and scope of the various embodiments. For example, the various devices, modules, generators, circuits, etc. described in the foregoing may be realized by using hardware circuitry (CMOS based hardware circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuits (ASICs), gate arrays, and macrocells).

Accordingly, the specification and drawings are to be regarded in an illustrative rather than restrictive sense, and the scope of the invention is defined by the following appended claims.

What is claimed is:

1. A built-in-self-test (BIST) circuit for a double data rate memory interface circuit for a system on a chip comprising:
   A. a signal multiplier for receiving a first clock signal from a tester and outputting a multiplied clock signal;
   B. a first multiplexer for selecting between a test clock input and a data strobe signal inputs and providing as an output an internal data strobe input signals;
   C. a delay magnitude generator coupled to the signal multiplier for receiving the multiplied clock signal and providing a second clock signal and a phase control signal;
   D. plural digitally controlled delay line blocks, each block receiving the second clock signal, the phase control signal, and outputting a phase shifted data strobe output signal in response to receiving an internal data strobe input signal;
   E. a second multiplexer selecting one of the internal data strobe input signals; and
   F. a third multiplexer selecting the phase shifted data strobe output signal corresponding to the selected internal data strobe input signal; and
   G. a phase detector for determining a phase difference between the selected internal data strobe input signal and the phase shifted data strobe output signal and outputting a phase difference value.

2. The BIST memory interface circuit of claim 1, wherein the signal multiplier is a phase locked loop.

3. The BIST memory interface circuit of claim 1, wherein the first multiplexer receives a control signal for controlling the mode selection such that the output signal from the first multiplier is the multiplied clock signal when the test mode is selected and a data strobe signal when the normal operating mode is selected.

4. The BIST memory interface circuit of claim 1, wherein the phase control signal is provided in the form of an 7-bit code value indicating the value of phase shift required.

5. The BIST memory interface circuit of claim 1, wherein the phase difference value is provided in the form of a 9-bit digital code and is used for determining between a pass or fail decision based on a pre-determined reference value.

6. A method for self-testing a double data rate (DDR) memory interface on a system on a chip comprising:
   A. generating in digitally controlled delay line a phase shifted data strobe output signal from an internal data strobe input signal, a clock signal, and a phase control input;
   B. measuring a phase difference between the internal data strobe input signal and the corresponding phase shifted data strobe output signal; and
   C. making a pass or fail decision based on the measured phase difference.

* * * * *